(12) United States Patent
Asari et al.

(10) Patent No.: US 8,940,096 B2
(45) Date of Patent: Jan. 27, 2015

(54) VERTICAL THERMAL PROCESSING APPARATUS AND SUBSTRATE SUPPORTER

(75) Inventors: Satoshi Asari, Oshu (JP); Katsuya Toba, Oshu (JP); Izumi Satoh, Oshu (JP); Yuichiro Sase, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 1075 days.

(21) Appl. No.: 12/549,465

(22) Filed: Aug. 28, 2009

(65) Prior Publication Data

US 2010/0058982 A1 Mar. 11, 2010

(30) Foreign Application Priority Data

Sep. 5, 2008 (JP) .................. 2008-228430

(51) Int. Cl.
*C23C 16/00* (2006.01)
*H01L 21/687* (2006.01)
*H01L 21/673* (2006.01)

(52) U.S. Cl.
CPC .... *H01L 21/68707* (2013.01); *H01L 21/67309* (2013.01)
USPC .......................................................... 118/728

(58) Field of Classification Search
USPC .................. 118/715, 724, 725, 728
See application file for complete search history.

(56) References Cited

U.S. PATENT DOCUMENTS

| | | | |
|---|---|---|---|
| 5,316,472 A | 5/1994 | Niino et al. | |
| 5,743,967 A | 4/1998 | Kobori et al. | |
| 6,796,439 B2 | 9/2004 | Araki | |
| 7,077,913 B2 | 7/2006 | Shimada | |
| 7,455,734 B2 | 11/2008 | Yamaguchi et al. | |
| 2003/0150386 A1* | 8/2003 | Shimada .................. | 118/728 |
| 2007/0006803 A1* | 1/2007 | Cadwell et al. .......... | 117/200 |
| 2007/0007646 A1* | 1/2007 | Yamaguchi et al. ..... | 257/727 |

FOREIGN PATENT DOCUMENTS

| | | |
|---|---|---|
| EP | 0 477 897 A2 | 4/1992 |
| JP | 04-133417 A1 | 5/1992 |
| JP | 05-166741 A1 | 2/1993 |
| JP | 09-092623 A1 | 4/1997 |

(Continued)

OTHER PUBLICATIONS

Japanese Office Action dated Mar. 13, 2012 (with English translation).

*Primary Examiner* — Maureen Gramaglia

(74) *Attorney, Agent, or Firm* — Burr & Brown, PLLC

(57) ABSTRACT

A vertical thermal processing apparatus including: a substrate supporter; a transfer mechanism to transfer substrates between the substrate supporter and a container; and a thermal processing furnace to process substrates that have been loaded thereinto with the substrate supporter. The substrate supporter includes: support columns located at intervals therebetween to surround the substrates, supporting parts for substrate and supporting parts for annular plate provided at the support columns in a tier-like manner, for alternately supporting peripheral parts of the substrates and of annular plates at predetermined intervals therebetween, and annular plates to be supported by the supporting parts for annular plate, when seen from a direction in which the substrates are transferred. Each of the annular plates has an intermediate part having a thickness smaller than thicknesses of the peripheral parts thereof to be supported by the support columns.

10 Claims, 6 Drawing Sheets

(56) References Cited

FOREIGN PATENT DOCUMENTS

| | | |
|---|---|---|
| JP | 11-040509 A1 | 2/1999 |
| JP | 2001-044260 | 2/2001 |
| JP | 2002-343730 A1 | 11/2002 |
| JP | 2003-282683 A1 | 10/2003 |
| JP | 2005-209875 A1 | 8/2005 |
| JP | 2008-235810 A1 | 10/2008 |
| KR | 10-0530407 | 7/2003 |
| WO | 2005/053016 A1 | 6/2005 |
| WO | 2008/095154 A1 | 8/2008 |

\* cited by examiner

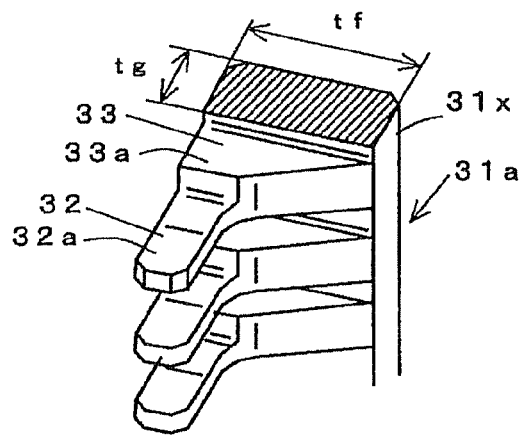
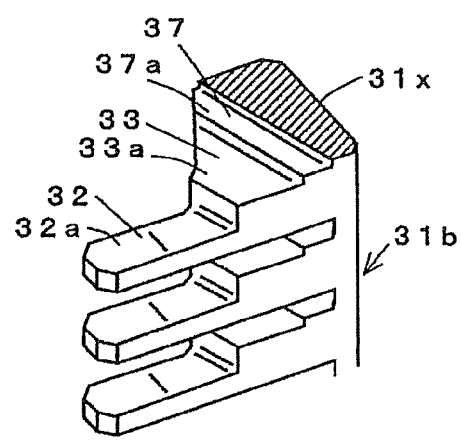
FIG. 5A   FIG. 5B
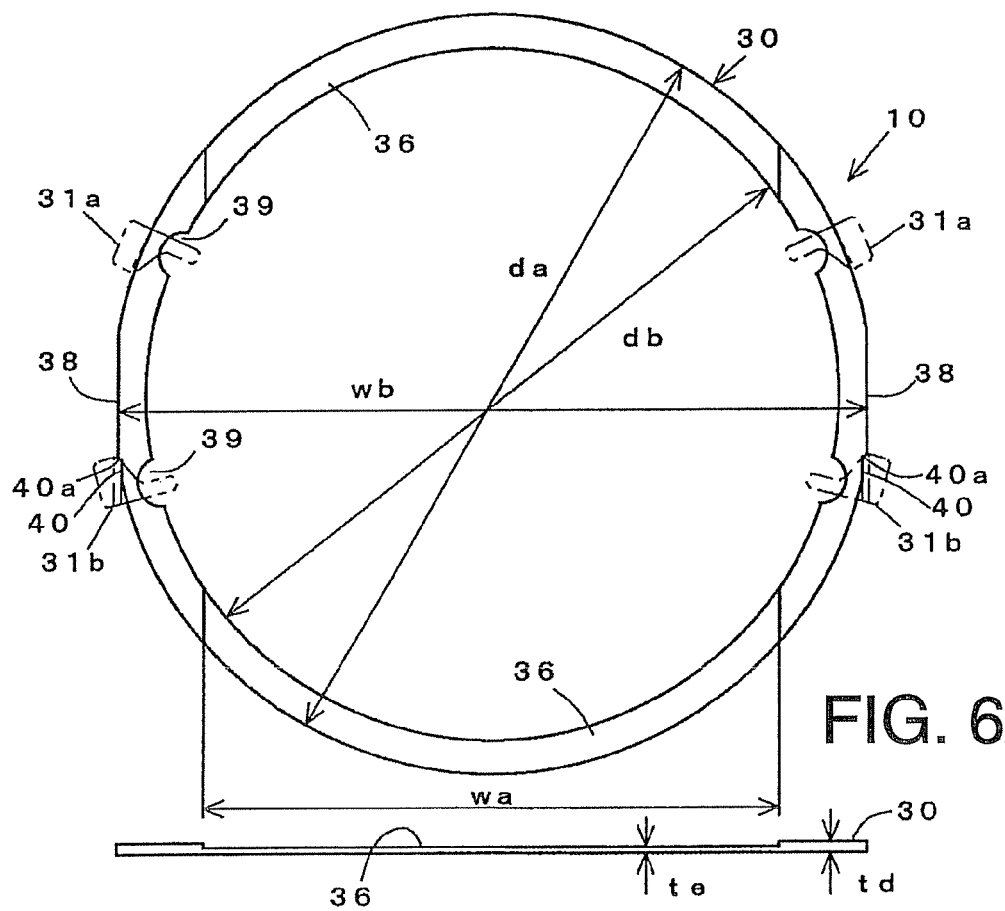
FIG. 6A
FIG. 6B

VERTICAL THERMAL PROCESSING APPARATUS AND SUBSTRATE SUPPORTER

CROSS REFERENCE TO RELATED APPLICATIONS

This application is based upon and claims the benefit of priority from the prior Japanese Patent Application No. 2008-228430 filed on Sep. 5, 2008, the entire contents of which are incorporated herein by reference.

BACKGROUND OF THE INVENTION

The present invention relates to a vertical thermal processing apparatus configured to thermally process a substrate to be processed.

DESCRIPTION OF RELATED ART

In a manufacturing process of semiconductor devices, various processing apparatuses (semiconductor manufacturing apparatuses) are used for subjecting substrates to be processed, such as semiconductor wafers (hereinafter referred to as "wafers") to processes such as oxidation processes, diffusion processes, and CVD (Chemical Vapor Deposition) processes. As one of these apparatuses, there has been known a batch-type of vertical thermal processing apparatus, which is capable of thermally processing a number of substrates to be processed at the same time.

The batch-type of vertical thermal processing apparatus includes: a thermal processing furnace; a substrate supporter (also referred to as "boat") that is loaded to and unloaded from the thermal processing furnace, while supporting a plurality of wafers with predetermined intervals (pitch) therebetween in a vertical direction; and a transfer mechanism configured to transfer a plurality of wafers between the boat and a container (also referred to as FOUP) capable of containing a plurality of wafers with predetermined intervals therebetween. The transfer mechanism includes: a base table capable of being elevated, lowered, and rotated; and a plurality of transfer plates (also referred to as "forks") for supporting wafers, the transfer plates being disposed on the base table such that the transfer plates can be moved forward and rearward.

As methods for transferring the plurality of wafers by the transfer mechanism, there are a soft landing method (method for softly transferring the plurality of wafers) which does not have an aligning (positioning) function, and an edge grip method (method for accurately and promptly transferring the plurality of wafers while gripping an edge of each wafer) which has an aligning function.

As a boat, there has been known, in addition to a type of boat in which the plurality of wafers are respectively supported by a plurality of grooves or projections that are formed on a plurality of support columns, another type of boat in which the plurality of wafers are respectively supported on a plurality of annular plates (ring plates) having a diameter larger than that of the wafer via a plurality of substrate support pieces (see, JP4-133417A, for example). According to the latter type of boat, a desired film can be formed on each wafer without being influenced by the support columns, whereby an in-plane uniformity of the film thickness can be improved. In addition, a transfer operation of the transfer mechanism can be facilitated and accelerated.

In the aforementioned conventional boat, it is difficult to narrow pitches at which the wafers are placed, because of the structure in which the substrate support pieces are disposed on the upper surfaces of the annular plates. In particular, when a ring boat is used, only a limited number of wafers can be transferred, i.e., the number of wafers to be processed is undesirably limited (the uppermost limit is at most about 75 wafers). Namely, in the case of the conventional ring boat, since the annular plates are welded to the support columns, clearances thereof are likely to be narrowed by deformation thereof which may be caused by a thermal influence or the like. Thus, it is difficult to narrow the pitches.

SUMMARY OF THE INVENTION

The present invention has been made in view of the above circumstances. The object of the present invention is to provide a vertical thermal processing apparatus capable of achieving a narrower pitch whereby the number of substrates to be processed can be increased.

The present invention is a vertical thermal processing apparatus comprising: a substrate supporter capable of supporting a plurality of substrates to be processed in a tier-like manner at predetermined intervals therebetween; a transfer mechanism configured to transfer the plurality of substrates to be processed between the substrate supporter and a container capable of containing the plurality of substrates to be processed; and a thermal processing furnace configured to thermally process the plurality of substrates to be processed that have been loaded thereinto together with the substrate supporter; wherein the substrate supporter includes: a plurality of support columns located at intervals therebetween to surround the substrates to be processed, supporting parts for substrate and supporting parts for annular plate which are provided at the plurality of support columns in a tier-like manner, for alternately supporting peripheral parts of the substrates to be processed and of annular plates at predetermined intervals therebetween, and a plurality of annular plates to be supported by the supporting parts for annular plate, when seen from a direction in which the substrates to be processed are transferred, each of the plurality of annular plates has an intermediate part having a thickness smaller than thicknesses of the peripheral parts thereof to be supported by the support columns.

According to the present invention, it is possible to achieve a narrower pitch, whereby the number of substrates to be processed can be increased.

Alternatively, the present invention is a substrate supporter capable of supporting a plurality of substrates to be processed in a tier-like manner at predetermined intervals therebetween, the substrate supporter comprising: a plurality of support columns located at intervals therebetween to surround the substrates to be processed; supporting parts for substrate and supporting parts for annular plate which are provided at the plurality of support columns in a tier-like manner, for alternately supporting peripheral parts of the substrates to be processed and of annular plates at predetermined intervals therebetween, and a plurality of annular plates to be supported by the supporting parts for annular plate; wherein, when seen from a direction in which the substrates to be processed are transferred, each of the plurality of annular plates has an intermediate part having a thickness smaller than thicknesses of the peripheral parts thereof to be supported by the support columns.

According to the present invention, it is possible to achieve a narrower pitch, whereby the number of substrates to be processed can be increased.

Preferably, the plurality of support columns are composed of right and left columns on a front side and of right and left columns on a rear side in the direction in which the substrates to be processed are transferred; the right and left support columns on the front side are respectively provided with stepped guide grooves at positions above cove parts of the supporting parts for annular plate; each of the plurality of annular plates has cutouts by which the annular plate can be received from the guide grooves onto the supporting parts for annular plate, when the annular plate is slid along the guide grooves so that the annular plate abuts on cove parts of the supporting parts for annular plate of the right and left support columns on the rear side.

In this case, more preferably, each cutout has a clearance in the transfer direction; each of the supporting parts for annular plate is configured to position the annular plate when the annular plate is drawn toward the front side by the clearance.

In addition, preferably, a diameter of the annular plate is larger than a width between the opposed guide grooves of the right and left support columns, and opposed parts of the annular plate have cutout parallel parts that maintain a width smaller than the width between the opposed guide grooves.

In addition, preferably, each of the support columns has a substantially rectangular cross-section in which a length in a circumferential direction of the annular plate to be supported by the supporting part for annular plate is longer than a length in a radial direction thereof; and a shape of a cross-section of a structure including the supporting part for substrate and the support column is a substantially L-shape.

In addition, preferably, cutouts are formed in an inner edge of the annular plate opposed to the support columns.

BRIEF DESCRIPTION OF THE DRAWINGS

FIG. 5A is an enlarged view of the part A of FIG. 4;

FIG. 5B is an enlarged view of the part B of FIG. 4;

FIG. 6A is a plan view of an annular plate;

FIG. 6B is a front view of the annular plate;

DETAILED DESCRIPTION OF THE INVENTION

Figure 1:
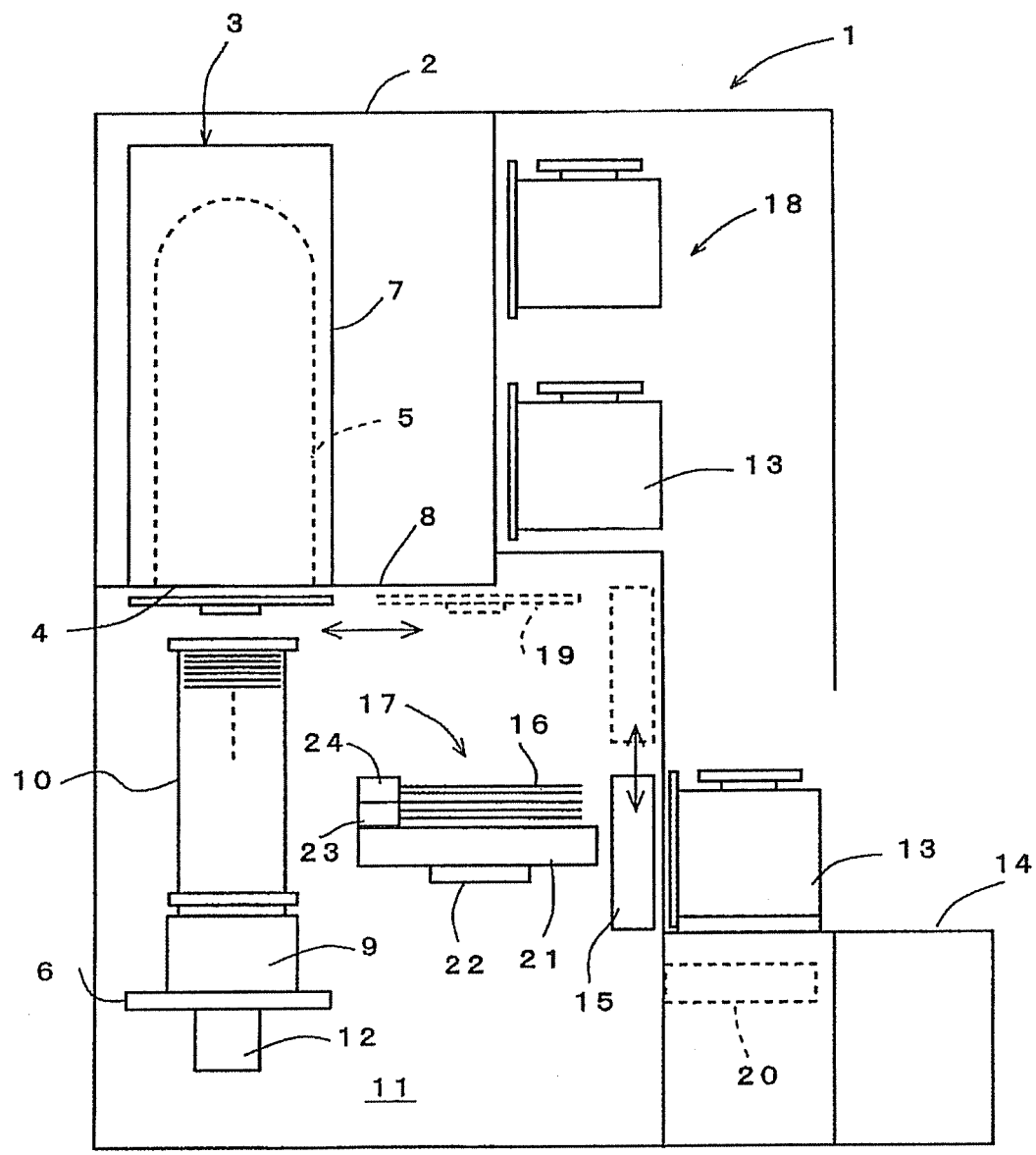
FIG. 1 is a longitudinal sectional view schematically showing a vertical thermal processing apparatus in one embodiment of the present invention.

The best mode for carrying out the present invention will be described below with reference to the attached drawings. FIG. 1 is a longitudinally sectional view schematically showing a vertical thermal processing apparatus in one embodiment of the present invention.

As shown in FIG. 1, the vertical thermal processing apparatus 1 includes a housing 2 defining an outer profile. Disposed in an upper part of the housing 2 is a vertical thermal processing furnace 3 configured to accommodate a plurality of substrates to be processed, such as thin circular semiconductor wafers w, and to perform thereto a predetermined process, such as a CVD process. The thermal processing furnace 3 is mainly composed of: a reaction tube 5 made of e.g., quartz, which is a longitudinal processing container (vessel) having a lower opening as a furnace opening 4; a lid member 6 capable of being elevated and lowered so as to close and open the furnace opening 4 of the reaction tube 5; and a heater (heating device) 7 disposed to surround a circumference of the reaction tube 5 so as to heat an inside of the reaction tube 5 to a predetermined temperature of, e.g., 300° C. to 1200° C.

In the housing 2, there are horizontally disposed the reaction tube 5 constituting the thermal processing furnace 3, and a base plate 8 made of, e.g., SUS, on which the heater 7 can be placed. The base plate 8 has an opening, not shown, through which the reaction tube 5 can be inserted upward from below.

An outward flange part is formed on a lower end of the reaction tube 5. When this flange part is held (secured) by a flange holding member onto the base plate 8, the reaction tube 5 is fixed to the base plate 8 in a state wherein the reaction tube 5 has been inserted upward through the opening of the base plate 8 from below. The reaction tube 5 can be detached downward from the base plate 8 so as to be cleaned, etc. Connected to the reaction tube 5 are a plurality of gas inlet pipes, through which a process gas and an inert gas for purging are introduced, and a drain pipe having a vacuum pump and a pressure control valve (illustration omitted), which are capable of reducing a pressure in the reaction tube 5. Alternatively, a cylindrical manifold having a gas inlet port and a drain port, to which a plurality of gas inlet pipes and a drain pipe can be connected, may be connected to a lower end of the reaction tube 5. In this case, the manifold defines the furnace opening.

A loading area (operation region) 11 is disposed below the base plate 8 in the housing 2. In the loading area 11, a boat (substrate supporter) 10 placed on the lid member 6 via a heat retaining tube 9 is loaded into the thermal processing furnace 3 (i.e., the reaction tube 5) and is unloaded from the thermal processing furnace 3. In addition, in the loading area 11, a plurality of wafers w are transferred to or from the boat 10. The loading area 11 is equipped with an elevating and lowering mechanism 12 for elevating and lowering the lid member 6 so as to load and unload the boat 10.

The lid member 6 is configured to be brought into contact with the opening end of the furnace opening 4 so as to hermetically seal the furnace opening 4. An upper part of the lid member 6 can receive the boat 10 via the heat retaining tube 9. The heat retaining tube 9 is a means for preventing heat release from the furnace opening 4. Disposed on the upper part of the lid member 6 is a turn table, not shown, capable of being turned (rotated), on which the heat retaining tube 9 is placed. Further, disposed below the lid member 6 is a turning mechanism, not shown, for turning (rotating) the turn table.

In front of the housing 2, there is disposed a stage (load port) 14 on which a container 13, which is capable of containing a plurality of, e.g., twenty five wafers at predetermined intervals therebetween, can be placed for loading and unloading the plurality of wafers to and from the housing 2. The container 13 is a hermetically sealable container (also referred to as "FOUP") having a cover on a front surface thereof, the cover being attachable and detachable to and from the container 13. In a front part of the loading area 11, there is disposed a door mechanism 15 configured to detach the cover of the container 13 so as to communicate the inside of the container 13 with the loading area 11. In addition, disposed in the loading area 11 is a transfer mechanism 17 having a plurality of forks (transfer plates) 16, which are arranged at predetermined intervals, for transferring the wafers w between the container 13 and the boat 10.

Outside the loading area 11 and at a front upper portion in the housing 2, there are a storage shelf part 18, in which the containers 13 can be stored, and a conveyance mechanism, not shown, for conveying the containers 13 from the stage 14 to the storage shelf part 18 and vice versa. A shutter mechanism 19 is disposed in an upper portion of the loading area 11. When the lid member 6 is lowered so that the furnace opening 4 is opened, the shutter mechanism 19 covers (or blocks) the furnace opening 4 so as to restrain or prevent release of a high-temperature heat from the furnace opening 4. Disposed in a lower part of the stage 14 is an aligning device (aligner) 20 capable of aligning cutouts (notches) formed in outer circumferences of the wafers w to be transferred by the transfer mechanism 17.

The transfer mechanism 17 has a plurality of, e.g., five transfer plates (also referred to as "forks") 16 for supporting a plurality of, e.g., five wafers at predetermined intervals therebetween in the up and down direction. In this case, the middle fork can independently move forward and rearward. Meanwhile, the other forks (first, second, fourth, and fifth forks) can integrally move forward and rearward, and also pitches therebetween in the up and down direction can be steplessly changed by a pitch change mechanism, with the middle fork as a reference. This is because the transfer mechanism 17 can cope with a case in which the pitches between wafers contained in the container 13 and the pitches between wafers supported by the boat 10 are different from each other. Even in this case, a plurality of wafers can be simultaneously transferred between the container 13 and the boat 10 with the aid of the pitch change mechanism.

The transfer mechanism 17 has a base table 21 capable of being elevated, lowered, and rotated. To be specific, the transfer mechanism 17 has an elevating and lowering arm 22 capable of moving in the up and down direction (capable of elevating and lowering) by means of a ball screw or the like. The box-like base table 21 is mounted on the elevating and lowering arm 22 such that the base table 21 can be horizontally rotated. On the base table 21, a first move-driving member 23 capable of causing the middle one fork 16 to move forward and rearward, and a second move-driving member 24 capable of causing the two forks disposed above the middle fork and the two forks disposed therebelow, i.e., the four forks 16 to move forward and rearward, are disposed along a longitudinal direction of the base table 21, i.e., along the horizontal direction. Thus, a single-wafer transfer mode in which one wafer is transferred by an independent operation of the first move-driving member 23, and a batch transfer mode in which five wafers are simultaneously transferred by a cooperation of the first and the second move-driving members 23, 24, can be selectively performed. In order to respectively operate the first and the second move-driving mechanism 23, 24, a move-driving mechanism, not shown, is disposed in the base table 21. As the move-driving mechanism and the pitch change (pitch-changing) mechanism, the mechanisms of a type described in JP2001-44260A, for example, may be used.

The transfer mechanism 17 has a coordinate system (coordinate axes) of an up and down axis (z axis), a rotational axis (θ axis), and a fore and aft axis (x axis). In addition, the transfer mechanism 17 has respective driving systems for causing the base table 21 to move in the direction of the up and down axis, for rotating the base table 21 about the rotational axis, for causing the forks 16 to move in the fore and aft direction via the first and the second move-driving members 23, 24, and for changing the pitches between the forks 16.

Figure 2A:
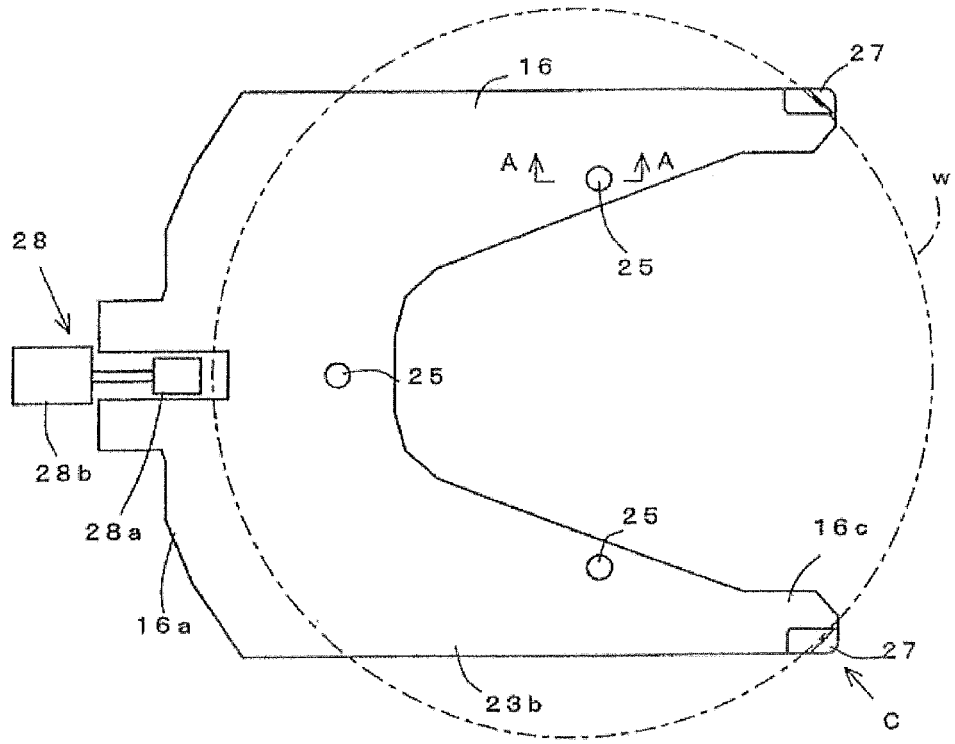
FIG. 2A is a plan view of a transfer plate.
Figure 2B:
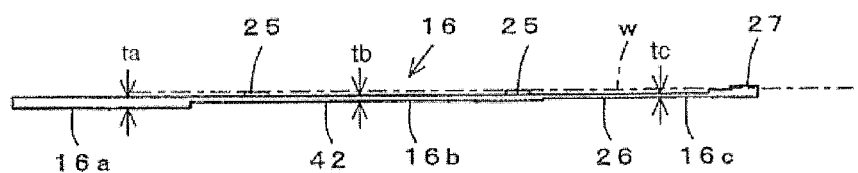
FIG. 2B is a side view of the transfer plate.

FIG. 2A is a plan view of the fork (transfer plate). FIG. 2B is a side view of the fork (transfer plate). As shown in FIGS. 2A and 2B, the fork 16 is of a cantilevered support structure horizontally extending from a proximal end (left side in the drawings) to a distal end (right side in the drawings) in the fore and aft direction. Disposed on an upper surface of the fork 16 are a plurality of support projections 25 for horizontally supporting a wafer w, at substantially central positions thereof and a rear position thereof in the fore and aft direction. The load (weight) of the wafer w is not supported on the distal side of the fork 16.

A step 26 is formed in a lower surface of the fork 16 at a region more distal than the substantially central support projections 25. Thus, a thickness tc of this region is formed smaller than a thickness of another part, e.g., a thickness ta of a proximal part. The illustrated fork 16 is formed such that the thickness ta of the proximal part (proximal side) 16a, a thickness tb of an intermediate part (between the substantially central support projections and the rear support projection) 16b, and the thickness tc of the distal part (distal side) 16c are reduced stepwise in this order. For example, ta=2.3 mm, tb=1.2 mm, and tc=0.8 mm.

The fork 16 is made of, e.g., alumina ceramics and has an elongated thin plate-like shape. In detail, the fork 16 has a substantially U-shape in plan view with a distal side from the intermediate part being divided into two. The substantially central support projections 25 are disposed on a right and a left locations on the upper surface of the intermediate part, and the rear support projection 25 is disposed on one central location on the proximal part. The support projection 25 is made of a heat-resistant resin such as a PEEK (Poly Ether Ether Ketone) material, and is formed into a flat (projecting height from the upper surface of the fork is about 0.3 mm), small circular shape (diameter is about 2 mm).

On the distal ends of the upper surface of the fork 16, there are disposed regulation pieces 27 for regulating the peripheral portion of the wafer so as not to allow the wafer to move in the distal direction (right direction in FIG. 2A) and the right and left direction (the up and down direction in FIG. 2A). In addition, on the proximal side of the fork 16, there is disposed a gripping mechanism 28 capable of moving forward and rearward so as to grip the wafer w between the gripping mechanism 28 and the regulation pieces 27, so as not to allow the wafer to move in the rear direction. The regulation piece 27 is preferably made of a heat-resistant resin such as a PEEK material.

The gripping mechanism 28 includes a contact member 28a to be brought into contact with the rear peripheral portion of the wafer w, and an air cylinder 28b as a driving means for causing the contact member 28a to move forward and rearward. A mapping sensor for detecting and mapping positions of the wafers in the boat may be disposed on the distal end of the fork 16.

Figure 3:
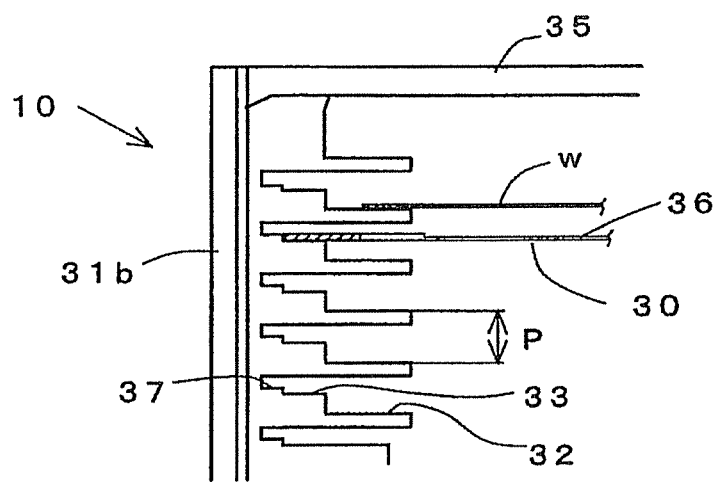
FIG. 3 is a partial front view showing an upper part of a boat.
Figure 4:
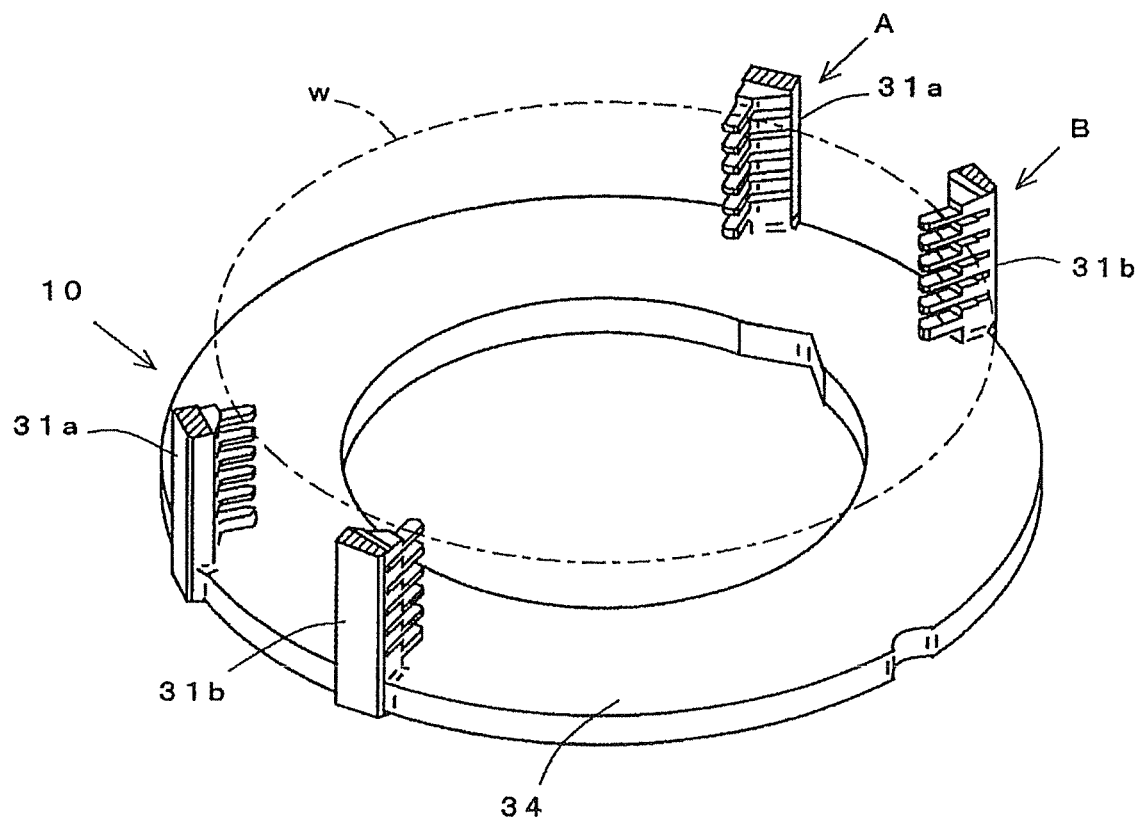
FIG. 4 is a partial perspective view showing a lower part of the boat.
Figure 7A:
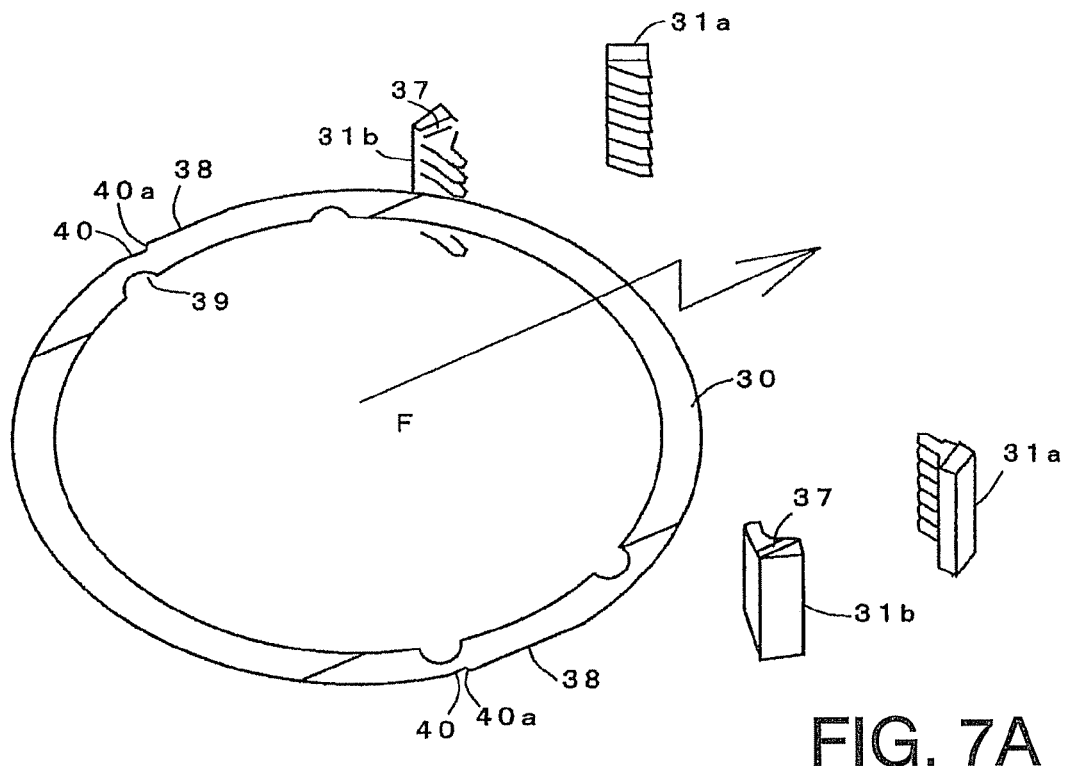
FIG. 7A is an explanatory view for explaining how the annular plate is mounted on support columns of the boat.
Figure 7B:
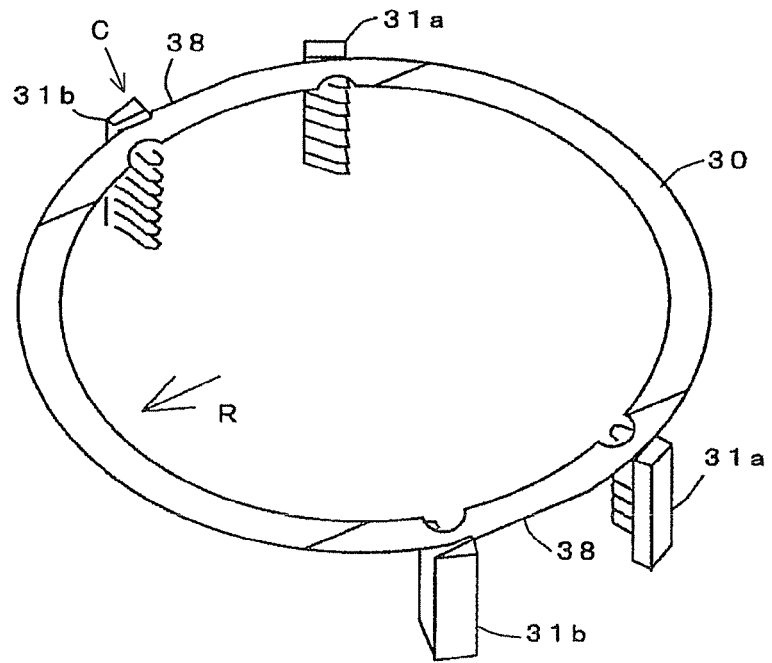
FIG. 7B is an explanatory view for explaining how the annular plate is mounted on the support columns of the boat.
Figure 8A:
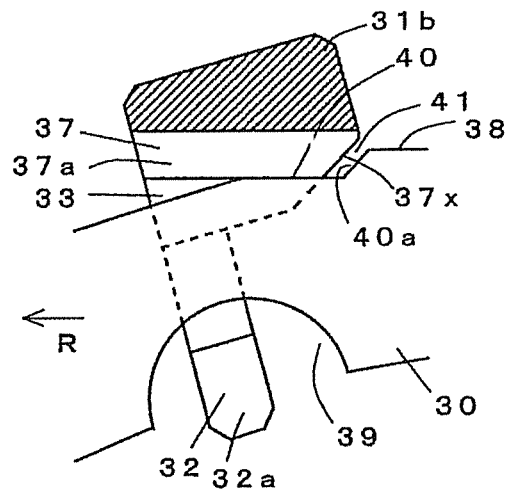
FIG. 8A is an enlarged plan view of the part C in FIG. 7B before a positioning operation.
Figure 8B:
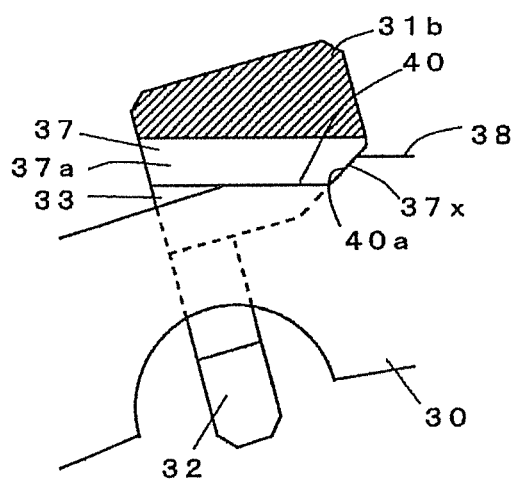
FIG. 8B is an enlarged plan view of the part C in FIG. 7B after the positioning operation.
Figure 8C:
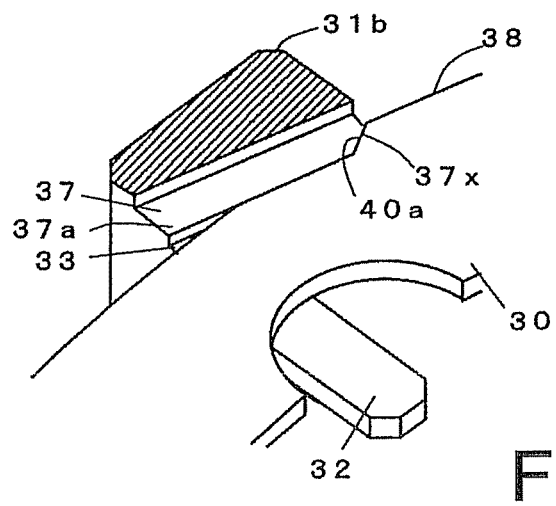
FIG. 8C is a perspective view of FIG. 8B after the positioning operation.

FIG. 3 is a partial front view showing an upper part of a boat. FIG. 4 is a partial perspective view showing a lower part of the boat. FIG. 5A is an enlarged view of the part A of FIG. 4. FIG. 5B is an enlarged view of the part B of FIG. 4. FIG. 6A is a plan view of an annular plate. FIG. 6B is a front view of the annular plate. FIG. 7A is an explanatory view for explaining how the annular plate is mounted on support columns of the boat. FIG. 7B is an explanatory view for explaining how the annular plate is mounted on the support columns of the boat. FIG. 8A is an enlarged plan view of the part C in FIG. 7B before a positioning operation. FIG. 8B is an enlarged plan view of the part C in FIG. 7B after the positioning operation. FIG. 8C is a perspective view of FIG. 8B after the positioning operation.

As shown in FIGS. 3 and 4, the boat 10 is made of, e.g., quartz, and is capable of horizontally supporting a plurality of wafers w of a large diameter, e.g., 300-mm diameter, by means of a plurality of annular plates (ring plates) 30, in a tier-like manner, at predetermined intervals P, e.g., at a pitch of 9 to 15 mm, preferably 9.4 mm, in an up and down (vertical) direction. The boat 10 includes a plurality of, e.g. four support columns 31a, 31a, 31b, 31b which are located at intervals therebetween to surround the wafers w, and supporting parts for substrate 32 and supporting parts for annular plate 33 which are disposed on the plurality of support columns in a tier-like manner, for alternately supporting the wafers w and the annular plates 30 at predetermined intervals therebetween.

The support columns 31a, 31b are interposed between a circular or annular bottom plate 34 and a circular or annular top plate 35. Among the plurality of support columns 31a, 31b, a distance between the supporting parts for annular plate 33 of the pair of right and left support columns 31b positioned on a front side, in a direction in which the wafers are transferred, is set wider than a distance between the supporting parts for annular plate 33 of the pair of right and left support columns 31a positioned on a rear side, in the direction in which the wafers are transferred. Thus, the annular plates 30 can be easily mounted and dismounted from the front side of the boat 10, while a rearward movement of each wafer w is regulated by the rear-side pair of the support columns 31a.

As shown in FIG. 6A, an outside diameter (diameter) da of the annular plate 30 is, e.g., 328 mm, and an inside diameter db of the annular plate 30 is e.g., 290 mm. As shown in FIG. 6B, in order to prevent interference between the annular plates 30 and the forks 16 of the transfer mechanism 17 that transfer the wafers w, an upper surface of each annular plate 30 has an interference prevention groove 36 having a predetermined width wa (250 mm) along the transfer direction and a predetermined depth (1 mm). Thus, when seen from the front side of the direction in which the wafers w are transferred, the annular plate 30 has an intermediate part having a thickness to that is smaller than thicknesses td of right and left opposed parts to be supported by the support columns 31a, 31b. More specifically, the thicknesses td of the opposed parts are 2 mm, and the thickness te of the intermediate part is 1 mm. Depending on cases, the inside diameter of the annular plate 30 may be slightly larger or smaller than the diameter of the wafer w.

The opposed parts of the annular plate 30 have cutout parallel parts (parallel opposed parts) 38 which are formed by cutting parts which may be positioned outside a width wb (324 mm) between opposed guide grooves 37, which are described below. Each of the support columns 31a, 31b has a substantially rectangular cross-section having a length tf in a circumferential direction of the annular plate 30 to be supported by the supporting part for annular plate 33 and a length tg in a radial direction thereof that is shorter than the length tf (see, FIG. 5A). Thus, the strength and the durability are improved within the limited design dimensions. In order to only improve the strength and the durability, the length tg of the cross-section may be larger than the length tf, or the length tg may be equal to the length tf. In addition, in order to eliminate non-uniformity of a process-gas flow caused by the support columns 31a, 31b, the annular plate 30 is provided with semicircular cutouts 39 in an inner edge opposed to the support columns 31a, 31b (see, FIG. 6). The shape of the cutout 39 may be triangular or rectangular, instead of semicircular.

As shown in FIGS. 5A and 5B, each of the support columns 31a, 31b includes: a support-column body part 31x having a substantially rectangular cross-section; the plurality of supporting parts for annular plate 33 extending radially inward from the support-column body part 31x, and respectively having supporting surfaces for annular plate 33a each having a trapezoidal plan surface; and the plurality of supporting parts for substrate 32 further extending radially inward from the supporting surface for annular plate 33a, and respectively having supporting surfaces for substrate 32a. The cross-section of each of the support columns 31a, 31b including the supporting part for substrate 32, which serves as a claw for supporting the wafer w, is a substantially L-shape. In order to ensure an in-plane uniformity of a process of the wafer, it is necessary to reduce a contact surface area between the supporting part for substrate 32 and a back-side (lower) surface of the wafer as much as possible. Thus, the cross-section of each of the support columns 31a, 31b is formed into the aforementioned substantially L-shape. However, in addition to the substantially L-shape, the cross-section of each of the support columns 31a, 31b including the supporting part for substrate 32 may be a substantially T-shape.

The right and left support columns 31b on the front side are respectively provided with the stepped guide grooves 37 at positions above cove parts of the supporting parts for annular plate 33. To be specific, the guide groove 37 is disposed such that a guide surface 37a is formed on a position slightly (about 1 mm) higher than the supporting surface for annular plate 33a. The width between the right and left guide grooves 37, 37 is smaller than the diameter da of the annular plate 30. In accordance thereto, the opposed parts of the annular plate 30 have the cutout parallel parts 38 which are formed by cutting the parts which might be positioned outside the width wb between the opposed guide grooves 37, 37, which is as described above. In other words, since the opposed cutout parallel parts 38 of the annular plate 30 are slidably regulated by the cove parts of the guide grooves 37, the annular plate 30 can be guided in the transfer direction (fore and aft direction), while the annular plate 30 is prevented from rotating.

As shown in FIGS. 6A to 8C, each of the annular plates 30 has cutouts 40 by which the annular plate 30 can be received from the guide grooves 37 onto the supporting parts for annular plate 33, when the annular plate 30 abuts on cove parts of the supporting parts for annular plate 33 of the right and left support columns 31a on the rear side. More specifically, the cutouts 40 for allowing disengagement (falling) of the annular plate 30 from the guide grooves 37 are formed in the ends of the cutout parallel parts 38 of the annular plate 30 (see, FIG. 6). Due to the provision of the cutouts 40, when the annular plate 30 falls by its own weight from the guide grooves 37 onto the supporting parts for annular plate 33, engagement parts 40a projecting from the cutouts 40 are engaged with parts 37x of the support columns 31b (rear edges of the guide grooves 37), so that the annular plate 30 can be held (the annular plate can be prevented from falling). In this case, as indicted by the arrow F in FIG. 7A, when the annular plate 30 positioned between the right and left support columns 31b is horizontally moved along the guide grooves 37 from the front side toward the rear side of the transfer direction so that the annular plate 30 abuts on the cove parts of the supporting parts for annular plate 33 of the support columns 31a on the rear side, the cutouts 40 coincide with the guide surfaces 37a of the guide grooves 37, whereby the annular plate 30 is received from the guide surfaces 37a onto the supporting surfaces for annular plate 33a.

At this time, as shown in FIG. 8A, there is a clearance 41 (gap, about 1 mm) for allowing the movement of the annular plate in the transfer direction, between the engagement part 40a of the cutout 40 and the rear edge 37x of the guide groove 37. By drawing the annular plate 30 toward the front side (direction indicated by an arrow R), the engagement part 40a of the cutout 40 is engaged with the rear edge 37x of the guide groove 37, whereby the annular plate 30 can be positioned.

Next, an operation of the vertical thermal processing apparatus 1 as structured above is described below. At first, a plurality of wafers w are transferred from the container 13 to the boat 10. At this time, the transfer mechanism 17 firstly causes the plurality of forks 16 to move forward so that the plurality of forks 16 are inserted into the container 13. Then, the plurality of wafers w are placed on the upper surfaces of the respective forks 16, and the respective forks 16 grip the respective wafers w. Then, the forks 16 gripping the wafers w are drawn from the container 13. Then, the transfer mechanism 17 changes the orientation of the forks 16 from the side of the container 13 to the side of the boat 10, and causes the respective forks 16 to move forward so that the forks 16 are inserted between the annular plates 30, which are arranged in a tier-like manner in the up and down direction. Thereafter, by lowering the forks 16, the wafers w are placed on the supporting surfaces for substrate 32a. After that, the forks 16 are retracted.

In particular, according to the vertical thermal processing apparatus 1, the boat 10 includes: the plurality of columns 31a, 31b, which are located at intervals therebetween to surround the wafers w; the supporting parts for substrates 32 and the supporting parts for annular plate 33, which are provided at the support columns 31a, 31b in a tier-like manner, for alternately supporting the wafers w and the annular plates 30 at predetermined intervals therebetween; and the plurality of annular plates 30 supported by the supporting parts for annular plate 33. In addition, when seen from the front side of the direction in which the wafers are transferred, each of the annular plates 30 has the intermediate part having the thickness to that is smaller than the thicknesses td of the right and left opposed parts to be supported by the support columns 31a, 31b. Thus, the interference between the annular plates 30 and the forks 16 of the transfer mechanism 17 can be avoided, whereby it is possible to achieve a narrower pitch in accordance with the reduced thickness. To be specific, although the boat 10 is a ring boat, the boat 10 can place thereon one hundred wafers w and process the same. Namely, the number of wafers to be processed can be significantly increased.

In this case, the gap between the thicknesses td of the right and left opposed parts and the thickness te of the intermediate part is realized by the interference prevention groove 36 formed in the upper surface of the annular plate 30. In addition, since the thicknesses td of the opposed parts of the annular plate 30 are larger than the thickness te of the intermediate part thereof so as to have a greater strength, the intermediate part of the annular plate 30 can be restrained or prevented from bending.

The plurality of columns 31a, 31b are composed of the right and left columns 31b on the front side in the direction in which the wafers are transferred, and the right and left columns 31a on the rear side. The right and left support columns 31b on the front side are respectively provided with the stepped guide grooves 37 at the positions above the cove parts of the supporting parts for annular plate 33. The diameter of each of the annular plates 30 is larger than the width wb between the opposed guide grooves 37. The opposed parts of the annular plate 30 have the cutout parallel parts 38 which are formed by cutting parts which might be positioned outside the width wb between the opposed guide grooves 37. Each of the annular plates 30 has the cutouts 40 by which the annular plate 30 can be received from the guide grooves 37 onto the supporting part for annular plate 33, when the annular plate 30 abuts on the cove parts of the supporting parts for annular plate 33 of the right and left support columns 31a on the rear side. Thus, the annular plate 30 can be easily mounted on and dismounted from the support columns 31a, 31b, as well as the annular plate 30 can be prevented from falling from the support columns 31a, 31b by vibrations or the like.

Since the annular plates 30 are detachably mounted on the support columns 31a, 31b, the annular plates 30 are more resistant to a thermal influence (deformation) than the conventional annular plates that have been welded to the support columns. Thus, it is easy to achieve a narrow pitch. In addition, the cutout 40 is provided with the clearance 41 in the transfer direction, and the annular plate 30 can be positioned by drawing the annular plate 30 toward the front side by the dimension of this clearance 41. Owing to this structure, the mounting precision of the annular plates 30 can be improved.

Disposed on the upper surface of each fork 16 are the support projections 25, which can horizontally support the wafer w. The support projections 25 are provided only at the two substantially central positions and the one rear position in the fore and aft direction. Thus, the load (weight) of the wafer w is not supported by the distal end of the fork 16. Thus, a bending amount on the distal side of the fork 16 is reduced. Therefore, it is not necessary for the fork 16 to have a large thickness in order to restrain the bending. Namely, the thickness of the fork is also reduced. Since the bending amount of the fork 16 and the thickness of the fork 16 can be reduced, the plurality of wafers can be transferred to the boat with narrower pitches, whereby the number of wafers to be processed per boat in the vertical thermal processing apparatus 1 can be increased.

Further, by providing the step in the lower surface of the fork 16 at the region more distal than the substantially central support projections 25, the thickness tc of the distal side region can be formed smaller than the thicknesses ta and tb of the other parts, whereby the thickness of the fork 16 can be reduced. Furthermore, in this example, due to the provision of the step 42 in the lower surface of the intermediate part of the fork 16, the thickness of the fork 16 can be formed smaller from the proximal side in a stepwise manner, whereby the thickness of the fork 16 can be further reduced. Therefore, the wafers can be transferred to a boat of further narrower pitches.

In addition, since each of the support projections 25 is made of a PEEK material and is formed into the flat, small circular shape, the wafer w can be brought into contact with only small areas or points but can be stably supported, without increasing the substantial thickness of the fork 16. In addition, the fork 16 has the substantially U-shape in plan view, with the substantially central support projections 25 being disposed on the two right and left locations on the upper surface of the fork 16, and the rear support projection 25 being disposed on the one central location on the proximal side. Therefore, the wafer w can be stably supported by the three-point support manner.

Disposed on the distal upper surface of the fork 16 are the regulation pieces 27 that regulate the peripheral portion of the wafer so as not to allow the wafer to move in the distal direction and the right and left direction. In addition, disposed on the proximal side of the fork 16 is the gripping mechanism 28 capable of moving forward and rearward and of gripping the wafer w between the gripping mechanism 28 and the regulation pieces 27. Therefore, although the fork has only a small thickness, the fork can reliably grip the wafer and rapidly transfer the same. As a result, processing ability can be improved.

After the wafers have been transferred to the boat 10 according to the manner as described above, the lid member 6 is elevated so that the boat 10 is loaded into the thermal processing furnace 3. Then, the wafers are thermally processed at a predetermined temperature, at a predetermined pressure, and under a predetermined gas atmosphere. Upon completion of the thermal process, the lid member 6 is lowered so that the boat 10 is unloaded from the thermal processing furnace 3 to the loading area 11. Then, the processed wafers are transferred from the boat 10 to the container 13 by the transfer mechanism 17 in the reverse order as described above.

Although the one embodiment of the present invention has been described in detail with reference to the drawings, the present invention is not limited to the aforementioned embodiment, and can be variously modified within a scope not departing from the concept of the present invention.

The invention claimed is:

1. A vertical thermal processing apparatus comprising:
 a substrate supporter capable of supporting a plurality of substrates to be processed in a tier-like manner at predetermined intervals therebetween;
 a transfer mechanism configured to transfer the plurality of substrates to be processed between the substrate supporter and a container capable of containing the plurality of substrates to be processed; and
 a thermal processing furnace configured to thermally process the plurality of substrates to be processed that have been loaded thereinto together with the substrate supporter;
 wherein:
 the substrate supporter includes:
 a plurality of support columns located at intervals therebetween to surround the substrates to be processed,
 supporting parts for substrate and supporting parts for annular plate which are provided at the plurality of support columns in a tier-like manner, for alternately supporting peripheral parts of the substrates to be processed and of annular plates at predetermined intervals therebetween, the supporting parts for annular plate respectively extending radially inward from the plurality of support columns and having supporting surfaces for an annular plate, the supporting parts for substrate respectively further extending radially inward from the supporting surfaces for annular plate and having supporting surfaces for a substrate, which are lower than the supporting surfaces for the annular plate,
 a plurality of annular plates to be supported by the supporting parts for annular plate,
 when seen from a direction in which the substrates to be processed are transferred, each of the plurality of annular plates has an intermediate part having a thickness smaller than thicknesses of the peripheral parts thereof to be supported by the support columns,
 each of the support columns has a substantially rectangular horizontal cross-section in which a length in a circumferential direction of the annular plate to be supported by the supporting part for annular plate is longer than a length in a radial direction thereof, and
 a shape of a horizontal cross-section of a structure including the supporting part for substrate and the support column is one of a substantially L-shape and a substantially T-shape,
 wherein cutouts are formed in an inner edge of the annular plate opposed to the support columns.

2. The vertical thermal processing apparatus according to claim 1, wherein:
 the plurality of support columns are composed of right and left columns on a front side and of right and left columns on a rear side in the direction in which the substrates to be processed are transferred;
 the right and left support columns on the front side are respectively provided with stepped guide grooves at positions above cove parts of the supporting parts for annular plate;
 each of the plurality of annular plates has cutouts by which the annular plate can be received from the guide grooves onto the supporting parts for annular plate, when the annular plate is slid along the guide grooves so that the annular plate abuts on cove parts of the supporting parts for annular plate of the right and left support columns on the rear side.

3. The vertical thermal processing apparatus according to claim 2, wherein:
 each cutout has a clearance in the transfer direction;
 each of the supporting parts for annular plate is configured to position the annular plate when the annular plate is drawn toward the front side by the clearance.

4. The vertical thermal processing apparatus according to claim 2, wherein
 a diameter of the annular plate is larger than a width between the opposed guide grooves of the right and left support columns, and opposed parts of the annular plate have cutout parallel parts that maintain a width smaller than the width between the opposed guide grooves.

5. The vertical thermal processing apparatus according to claim 1, wherein
 each of the support columns has a substantially rectangular cross-section in which a length in a circumferential direction of the annular plate to be supported by the supporting part for annular plate is longer than a length in a radial direction thereof; and
 the shape of a cross-section of a structure including the supporting part for substrate and the support column is the substantially L-shape.

6. A substrate supporter capable of supporting a plurality of substrates to be processed in a tier-like manner at predetermined intervals therebetween, the substrate supporter comprising:
 a plurality of support columns located at intervals therebetween to surround the substrates to be processed;
 supporting parts for substrate and supporting parts for annular plate which are provided at the plurality of support columns in a tier-like manner, for alternately supporting peripheral parts of the substrates to be processed and of annular plates at predetermined intervals therebetween, the supporting parts for annular plate respectively extending radially inward from the plurality of support columns and have supporting surfaces for an annular plate, the supporting parts for substrate respectively further extending radially inward from the supporting surfaces for annular plate and having supporting surfaces for a substrate, which are lower than the supporting surfaces for the annular plate,
 a plurality of annular plates to be supported by the supporting parts for annular plate;
 wherein, when seen from a direction in which the substrates to be processed are transferred, each of the plurality of annular plates has an intermediate part having a thickness smaller than thicknesses of the peripheral parts thereof to be supported by the support columns,
 each of the support columns has a substantially rectangular horizontal cross-section in which a length in a circumferential direction of the annular plate to be supported by the supporting part for annular plate is longer than a length in a radial direction thereof, and a shape of a horizontal cross-section of a structure including the supporting part for substrate and the support column is one of a substantially L-shape and a substantially T-shape,
wherein cutouts are formed in an inner edge of the annular plate opposed to the support columns.

7. The substrate supporter according to claim 6, wherein
the plurality of support columns are composed of right and left columns on a front side and of right and left columns on a rear side in the direction in which the substrates to be processed are transferred;
the right and left support columns on the front side are respectively provided with stepped guide grooves at positions above cove parts of the supporting parts for annular plate;
each of the plurality of annular plates has cutouts by which the annular plate can be received from the guide grooves onto the supporting parts for annular plate, when the annular plate is slid along the guide grooves so that the annular plate abuts on cove parts of the supporting parts for annular plate of the right and left support columns on the rear side.

8. The substrate supporter according to claim 7, wherein
each cutout has a clearance in the transfer direction;
each of the supporting parts for annular plate is configured to position the annular plate when the annular plate is drawn toward the front side by the clearance.

9. The substrate supporter according to claim 7, wherein a diameter of the annular plate is larger than a width between the opposed guide grooves of the right and left support columns, and opposed parts of the annular plate have cutout parallel parts that maintain a width smaller than the width between the opposed guide grooves.

10. The substrate supporter according to claim 6, wherein
each of the support columns has a substantially rectangular cross-section in which a length in a circumferential direction of the annular plate to be supported by the supporting part for annular plate is longer than a length in a radial direction thereof; and
the shape of a cross-section of a structure including the supporting part for substrate and the support column is the substantially L-shape.

* * * * *